(12) United States Patent
Park et al.

(10) Patent No.: US 7,573,142 B2
(45) Date of Patent: Aug. 11, 2009

(54) ALIGNMENT KEY STRUCTURE IN A SEMICONDUCTOR DEVICE AND METHOD OF FORMING THE SAME

(75) Inventors: Seok-Han Park, Yongin-si (KR); Joo-Sung Park, Yongin-si (KR); Dong-Hyun Han, Gungpo-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 442 days.

(21) Appl. No.: 11/407,273

(22) Filed: Apr. 19, 2006

(65) Prior Publication Data
US 2006/0246648 A1 Nov. 2, 2006

(30) Foreign Application Priority Data
Apr. 29, 2005 (KR) ...................... 10-2005-0036322

(51) Int. Cl.
*H01L 23/544* (2006.01)
(52) U.S. Cl. .................. 257/797; 257/758; 438/106
(58) Field of Classification Search ................ 257/797, 257/758, 784, 786, 750
See application file for complete search history.

(56) References Cited

U.S. PATENT DOCUMENTS

| 6,228,743 | B1 | 5/2001 | Chen et al. | 438/401 |
|---|---|---|---|---|
| 7,223,693 | B2* | 5/2007 | Choi et al. | 438/672 |
| 7,265,050 | B2* | 9/2007 | Choi et al. | 438/672 |
| 2006/0060945 | A1* | 3/2006 | Cho et al. | 257/622 |
| 2006/0138673 | A1* | 6/2006 | Kim | 257/779 |
| 2008/0203590 | A1* | 8/2008 | Kang et al. | 257/797 |

FOREIGN PATENT DOCUMENTS

| JP | 2001-127240 | 5/2001 |
|---|---|---|
| KR | 1020040053451 | 6/2004 |

* cited by examiner

*Primary Examiner*—Matthew S. Smith
(74) *Attorney, Agent, or Firm*—F. Chau & Associates, LLC

(57) ABSTRACT

An alignment key structure in a semiconductor device is provided. The alignment key structure includes an insulation layer formed on a substrate, and a passivation layer pattern formed on the insulation layer. The insulation layer includes a plurality of metal wirings. The passivation layer pattern includes a first opening that exposes at least one of the metal wirings. Moreover, the first opening has a width which is narrower than a width of the exposed metal wiring.

34 Claims, 5 Drawing Sheets

ALIGNMENT KEY STRUCTURE IN A SEMICONDUCTOR DEVICE AND METHOD OF FORMING THE SAME

CROSS REFERENCE TO RELATED APPLICATION

This application claims priority under 35 USC § 119 to Korean Patent Application No. 2005-36322 filed on Apr. 29, 2005, the contents of which are incorporated by reference herein in its entirety.

BACKGROUND OF THE INVENTION

1. Field of the Invention

The present invention relates to an alignment key structure in a semiconductor device and to a method of manufacturing the same. More particularly, the present invention relates to an alignment key structure employed in a wire bonding process for electrically connecting a bonding pad of a semiconductor device to lead of a lead frame using a conductive line, and to a method of manufacturing the same.

2. Description of the Related Art

A semiconductor device is generally manufactured by the following processes (i) a fabrication (FAB) process that forms electrical circuits on a semiconductor substrate such as a silicon wafer, (ii) an electrical die sorting (EDS) process that tests electrical characteristics of the semiconductor device and (iii) a packaging process that wraps the individual semiconductor device up.

In particular, a wire bonding process as part of the above-mentioned packaging process is performed for connecting a bonding pad formed on the semiconductor device with lead of a lead frame, using a conductive line such as a gold line.

FIG. 1 is a plan view showing upper structures of a conventional semiconductor device. FIG. 2 is a cross sectional view showing the upper structures of the conventional semiconductor device illustrated in FIG. 1.

Referring to FIGS. 1 and 2, semiconductor structures 102 are formed on a semiconductor substrate such as a silicon wafer. The semiconductor structures 102 have integrated circuits (not shown) that include a transistor, a capacitor, and a pad. A first insulating interlayer 112 and a second insulating interlayer 124 are formed on the semiconductor structures 102. The first insulating interlayer 112 includes a plurality of first metal wirings electrically contacted to the integrated circuits. The second insulating interlayer 124 includes a plurality of second metal wirings and a bonding pad 122.

Moreover, a passivation layer pattern 130 is formed on the second insulating interlayer 124 to protect the above semiconductor devices. In addition, a first opening 132 and a second opening 134 are formed in the passivation layer pattern 130. The first opening 132 serves as an alignment key in a wire bonding process. The second opening 134 exposes the bonding pad 122. The first opening 132 and the second opening 134 are connected with each other as shown in FIG. 2. Alternatively, the first opening 132 and the second opening 134 may be formed independently.

The first opening 132 typically has a clamp shape and exposes second metal wirings 120 adjacent to the bonding pad 122. The first opening 132 and the second opening 134 are formed by an etching process using an etchant such as plasma. However, the second metal wirings 120 can be subject to etch damage during the etching process. The consequences of such etch damage to the second metal wirings 120 will be described below.

Particularly, the second metal wirings 120 include a plurality of signal lines, power lines, and ground lines. Thus, when the signal lines are exposed through the first opening 132, signal noise may occur as a result of etch damage to the second metal wirings. The signal noise in turn may then deteriorate the reliability of the semiconductor device. In addition, since the signal lines have relatively narrower widths than the widths of the power lines or the ground lines, a short or failure of the signal lines may also occur during the etching process. Furthermore, when etch damage occurs to the second wirings 120, plasma etch damage may also occur in the first metal wirings 110 below the first opening 132 as well, which may in turn lead to further signal noise.

Accordingly there is a need in the art for an alignment key structure in a semiconductor device and a method of forming the same which prevents etching damage from occurring to metal wirings in a process for manufacturing a semiconductor device.

SUMMARY OF THE INVENTION

According to an example embodiment of the present invention, an alignment key structure in a semiconductor device is provided. The alignment key structure includes an insulation layer formed on a substrate, and a passivation layer pattern formed on the insulation layer. The insulation layer includes a plurality of metal wirings. The passivation layer pattern includes a first opening that exposes at least one of the metal wirings. Moreover, the first opening has a width that is narrower than a width of the exposed metal wiring.

In an example embodiment of the present invention, the first opening may have a width substantially narrower than a width of the exposed metal wiring.

In an example embodiment of the present invention, the first opening may expose a portion of the exposed metal wiring except for both edge portions of the exposed metal wiring.

In an example embodiment of the present invention, each of the both edge portions of the exposed metal wiring may have a width of about 0.1 μm to about 1.0 μm.

In an example embodiment of the present invention, the insulation layer may include a bonding pad adjacent to the exposed metal wiring.

In an example embodiment of the present invention, the passivation layer pattern may include a second opening that exposes the bonding pad.

In an example embodiment of the present invention, the process of manufacturing the semiconductor device may include a wire bonding process for electrically connecting the bonding pad to a conductive line.

In an example embodiment of the present invention, the exposed metal wiring may include a power line or a ground line.

In an example embodiment of the present invention, the exposed metal wiring may have the width substantially wider than widths of other metal wirings.

According to another example embodiment of the present invention, an alignment key structure in a semiconductor device is provided. The alignment key structure includes a first insulation layer formed on a substrate, a second insulation layer formed on the first insulation layer, and a passivation layer pattern formed on the second insulation layer. The first insulation layer includes a plurality of first metal wirings. The second insulation layer includes a plurality of second metal wirings and a bonding pad. The passivation layer pattern includes a first opening that exposes one of the second metal wirings adjacent to the bonding pad and serves as an alignment key in a process of manufacturing the semiconductor device.

In an example embodiment of the present invention, the first metal wirings may be extended along a first direction and the second metal wirings may be extended in a second direction substantially perpendicular to the first direction. The first metal wirings may be separated from the first opening along the second direction.

In an example embodiment of the present invention, one of the first metal wirings adjacent to the first opening may be separated from the first opening by an interval of about 0.1 µm to about 1.0 µm.

In an example embodiment of the present invention, the first opening may have a width substantially narrower than a width of the exposed second metal wiring, and the first opening may expose a central portion of the exposed second metal wiring except for both edge portions of the exposed second metal wiring.

In an example embodiment of the present invention, the passivation layer pattern may include a second opening that exposes the bonding pad.

In an example embodiment of the present invention, the first opening and the second opening may be connected to each other, and the first metal wirings may not be overlapped with a portion of the second insulation layer between the bonding pad and the exposed second metal wiring.

According to still another example embodiment of the present invention, an alignment key structure in a semiconductor device is provided. The alignment key structure includes a first insulation layer formed on a substrate, a second insulation layer formed on the first insulation layer, and a passivation layer pattern formed on the second insulation layer. The first insulation layer includes a plurality of first metal wirings, and the second insulation layer includes a plurality of second metal wirings. The passivation layer pattern includes one or more first openings that expose adjacent second metal wirings. In addition, the one or more first opening has a width which is narrower than a width of the exposed second metal wirings.

In an example embodiment of the present invention, the exposed second metal wirings may include a power line and a ground line. Alternatively, the exposed second metal wirings may include power lines and ground lines.

In an example embodiment of the present invention, the second insulation layer may include a bonding pad adjacent to the exposed second metal wirings.

In an example embodiment of the present invention, the passivation layer pattern may include a second opening that exposes the bonding pad.

In an example embodiment of the present invention, intervals among the first openings may be in a range of about 0.4 µm to about 2.0 µm.

In an example embodiment of the present invention, the first metal wirings may be extended along a first direction and the second metal wirings may be extended in a second direction substantially perpendicular to the first direction. The first metal wirings may be separated from the first openings along the second direction.

According to still another example embodiment of the present invention, a method of forming an alignment key structure in a semiconductor device is provided. In the method of forming the alignment key structure in the semiconductor device, an insulation layer including a plurality of metal wirings is formed on a substrate. A passivation layer pattern including a first opening is formed on the insulation layer. The first opening exposes at least one of the metal wirings and the first opening has a width which is narrower than a width of the exposed metal wiring.

In an example embodiment of the present invention, the first opening may have a width substantially narrower than a width of the exposed metal wiring.

In an example embodiment of the present invention, the first opening may expose a portion of the exposed metal wiring except for both edge portions of the exposed metal wiring.

In an example embodiment of the present invention, the insulation layer may be formed by forming the metal wirings on the substrate, and by forming the insulation layer on the metal wirings. Here, a bonding pad adjacent to the exposed metal wiring may be simultaneously formed in a formation of the metal wirings.

In an example embodiment of the present invention, the passivation layer pattern may be formed by forming a passivation layer on the insulation layer, and by partially etching the passivation layer and the insulation layer to form the first opening. Here, a second opening exposing the bonding pad may be simultaneously formed in a formation of the first opening.

In an example embodiment of the present invention, the exposed metal wiring may have a width substantially wider than widths of other metal wirings.

According to still another example embodiment of the present invention, there is provided a method of forming an alignment key structure in a semiconductor device. In the method of forming the alignment key structure in the semiconductor device, a first insulation layer including a plurality of first metal wirings is formed on a substrate. A second insulation layer including a plurality of second metal wirings and a bonding pad is formed on the first insulation layer. A passivation layer pattern including a first opening is formed on the second insulation layer. The first opening exposes one of the second metal wirings adjacent to the bonding pad and serves as an alignment key in a process of manufacturing the semiconductor device.

In an example embodiment of the present invention, the first metal wirings may be extended along a first direction and the second metal wirings may be extended in a second direction substantially perpendicular to the first direction. The first metal wirings may be separated from the first opening along the second direction.

In an example embodiment of the present invention, the first opening may have a width substantially narrower than a width of the exposed second metal wiring. The first opening may expose a central portion of the exposed second metal wiring except for both edge portions of the exposed second metal wiring.

In an example embodiment of the present invention, the passivation layer pattern may be formed by forming a passivation layer on the second insulation layer, and by partially etching the passivation layer and the second insulation layer to form the first opening. Here, a second opening exposing the bonding pad may be simultaneously formed in a formation of the first opening.

In an example embodiment of the present invention, the first opening and the second opening may be connected to each other. The first metal wirings may not be overlapped with a portion of the second insulation layer between the bonding pad and the exposed second metal wiring.

According to still another example embodiment of the present invention, there is provided a method of forming an alignment key structure in a semiconductor device. In the method of forming the alignment key structure in the semiconductor device, a first insulation layer including a plurality of first metal wirings is formed on a substrate. A second insulation layer including a plurality of second metal wirings is formed on the first insulation layer. A passivation layer pattern including one or more first openings is formed on the second insulation layer. The one or more first openings expose adjacent second metal wirings and serve as alignment keys in a process for manufacturing the semiconductor device. In addition, the one or more first openings have a width substantially narrower than a width of the exposed second metal wirings.

In an example embodiment of the present invention, the exposed second metal wirings may have widths substantially wider than widths of other second metal wirings.

In an example embodiment of the present invention, the second insulation layer may be formed by forming the second metal wirings on the first insulation layer, and by forming the second insulation layer on the second metal wirings. Here, a bonding pad adjacent the exposed second metal wirings may be simultaneously formed in formations of the second metal wirings.

In an example embodiment of the present invention, the passivation layer pattern may be formed by forming a passivation layer on the second insulation layer, and by partially etching the passivation layer and the second insulation layer to form the first openings. Here, a second opening exposing the bonding pad may be simultaneously formed in formations of the first openings.

In an example embodiment of the present invention, the first metal wirings may be extended along a first direction and the second metal wirings may be extended in a second direction substantially perpendicular to the first direction. The first metal wirings may be separated from the first opening along the second direction.

According to the example embodiments of the present invention, a first opening may serve as an alignment key in a wire bonding process to expose a second metal wiring adjacent to a bonding pad. The first opening may have a width substantially narrower than a width of the second metal wiring. Thus, etching damage to the second metal wiring and etching damage to the first metal wiring may be effectively prevented in an etching process for forming the first opening. Additionally, if alignment errors are generated between the first opening and the second metal wiring, the damage to the first metal wiring may be prevented because the first metal wiring may be separated from the first opening. Thus, since the first and the second metal wirings are sufficiently protected during the formation of the first opening, signal noises in a semiconductor device including the first and the second metal wirings are reduced. As a result, the semiconductor device may have improved reliability and enhanced productivity.

BRIEF DESCRIPTION OF THE DRAWINGS

The above and other features and advantages of the present invention will become more apparent by describing in detailed example embodiments thereof with reference to the accompanying drawings, in which.

DESCRIPTION OF THE EXEMPLARY EMBODIMENTS OF THE INVENTION

Figure 1:
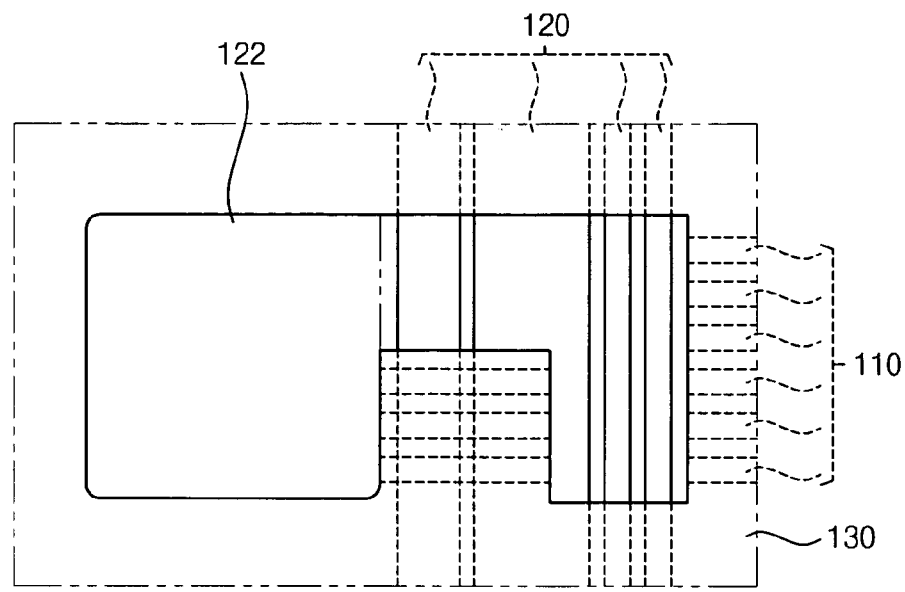
FIG. 1 is a plan view showing upper structures of a conventional semiconductor device.
Figure 2:
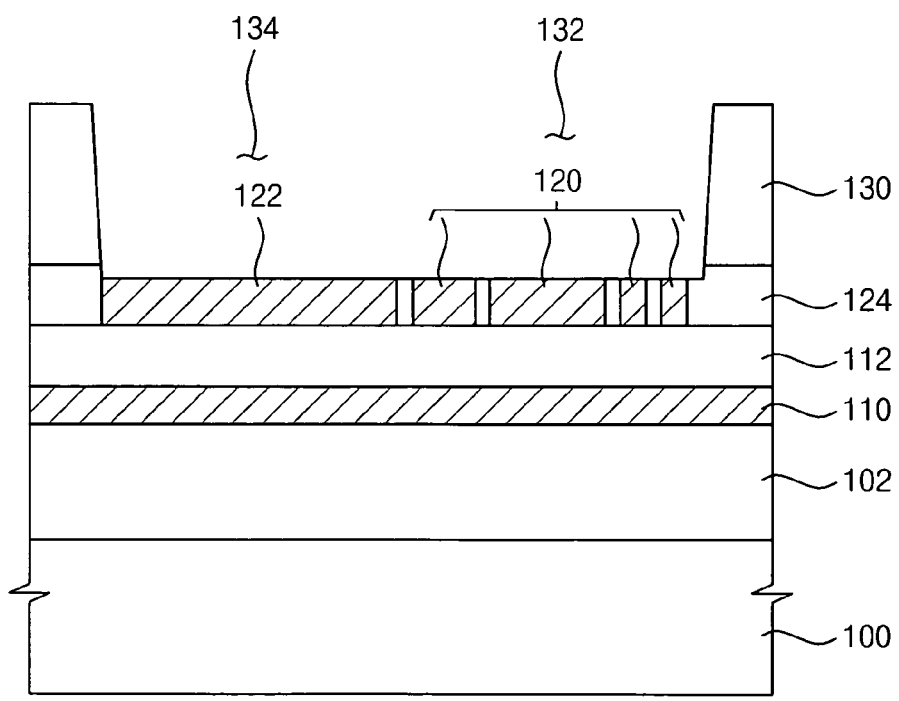
FIG. 2 is a cross sectional view showing the upper structures of the conventional semiconductor device in FIG. 1.

The present invention is described more fully hereinafter with reference to the accompanying drawings, in which example embodiments of the invention are shown. The present invention may, however, be embodied in many different forms and should not be construed as limited to the embodiments set forth herein. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Figure 3:
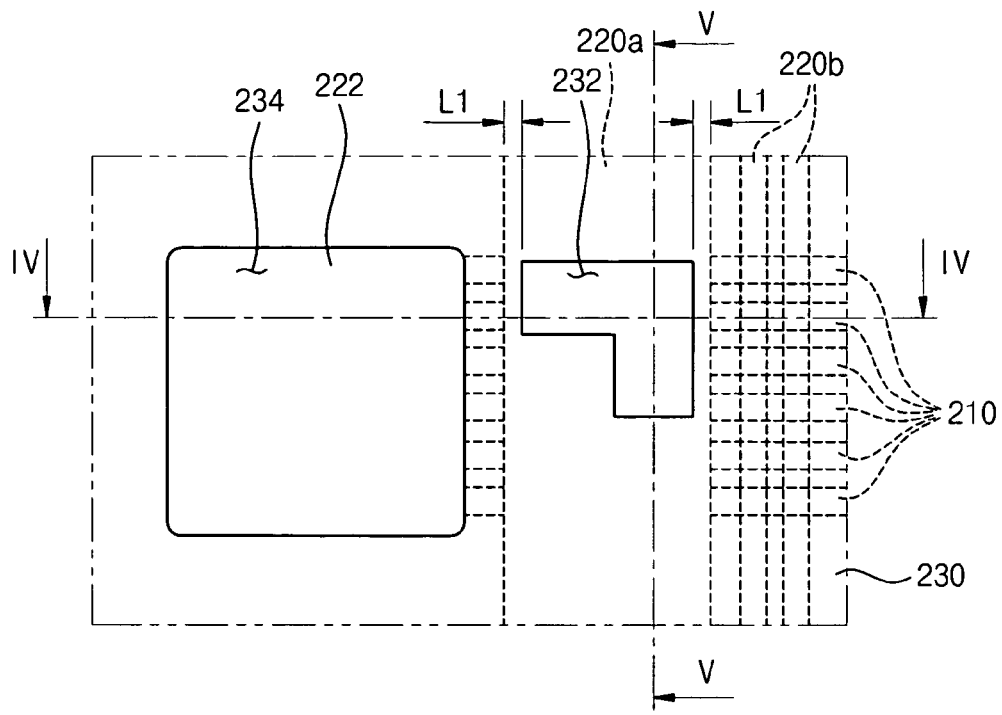
FIG. 3 is a plan view illustrating an alignment key structure in a semiconductor device in accordance with an example embodiment of the present invention.
Figure 4:
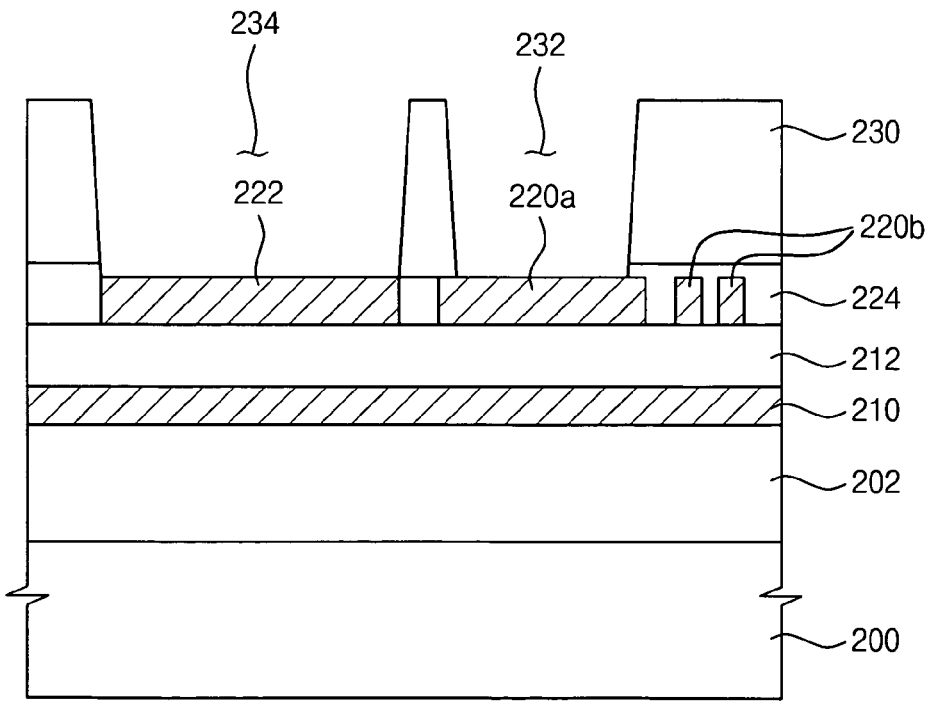
FIG. 4 is a cross sectional view illustrating the alignment key structure taken along a line of IV-IV' in FIG. 3.

FIG. 3 is a plan view illustrating an alignment key structure in a semiconductor device in accordance with an example embodiment of the present invention. FIG. 4 is a cross sectional view illustrating the alignment key structure taken along a line of IV-IV' in FIG. 3, and FIG. 5 is a cross sectional illustrating the alignment key structure view taken along a line of V-V' in FIG. 3.

Figure 5:
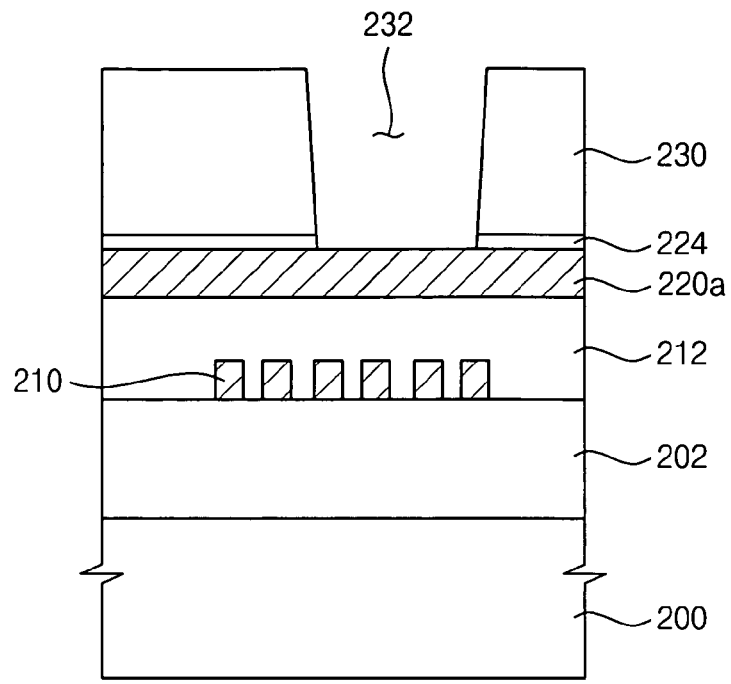
FIG. 5 is a cross sectional illustrating the alignment key structure view taken along a line of V-V' in FIG. 3.

Referring to FIGS. 3 to 5, an insulation structure 202 including integrated circuits is disposed on a substrate 200 such as a silicon wafer. A first insulating interlayer 212 is formed on the insulation structure 202. The first insulating interlayer 212 includes a plurality of first metal wirings 210 electrically contacted to the integrated circuits. A second insulating interlayer 224 is formed on the first insulating interlayer 212. The second insulating interlayer 224 includes a bonding pad 222, and a plurality of second metal wirings 220a and 220b electrically contacted to the integrated circuits.

In example embodiments of the present invention, the insulation structure 202 may include for example, the integrated circuits of a dynamic random access memory (DRAM) device, a static random access memory (SRAM) device, or a flash memory device. The first metal wirings 210 and the second metal wirings 220a and 220b may include a plurality of signal lines, power lines and/or ground lines, which are electrically contacted to the integrated circuits through, for example, contact plugs.

The bonding pad 222 may make electrical contact with the first metal wirings 210 through a contact plug. The bonding pad 222 may be electrically connected to lead of a lead frame through a conductive line such as a gold line in a subsequent wire bonding process.

The first and the second insulating interlayers 212 and 224 may include, for example a silicon nitride, a silicon oxide, a silicon oxynitride, or a low-k material. Additionally, the first and the second insulating interlayers 212 and 224 may each be formed by chemical vapor deposition (CVD) processes.

In the present example embodiment of the present invention, the first metal wirings 210, the second metal wirings 220a and 220b, and the bonding pad 222 may include, for example, tungsten (W), aluminum (Al), or copper (Cu). In addition, the first metal wirings 210, the second metal wirings 220a and 220b, and the bonding pad 222 may be formed through deposition processes such as, for example, physical vapor deposition (PVD) processes, CVD processes, and through photolithography processes. In another example embodiment of the present invention, the first metal wirings 210, the second metal wirings 220a and 220b, and the bonding pad 222 may be each formed by damascene processes.

As shown in FIG. 3, the first metal wirings 210 may be extended along a first direction, and the second metal wirings 220a and 220b may be extended in a second direction substantially perpendicular to the first direction. In an example embodiment of the present invention, each of the first metal wirings 210 and the second metal wirings 220a and 220b may include a barrier layer. The barrier layer may include, for example, a titanium nitride film, a tungsten nitride film, a tantalum nitride film, an aluminum nitride film, or a titanium aluminum nitride film.

A passivation layer pattern 230 is formed on the second insulating interlayer 224 to protect the second metal wirings 220a and 220b. The passivation layer pattern 230 includes a first opening 232 exposing one of the second metal wirings 220a, and a second opening 234 exposing the bonding pad 222. Moreover, the second metal wiring 220a exposed through the first opening 232 may be adjacent to the bonding pad 222. Additionally, the second metal wiring 220a exposed through the first opening 232 may serve as a power line or a ground line. Also, the second metal wiring 220a may have a width substantially greater than that of other second metal wirings 220b serving as signal lines.

Further, the passivation layer pattern 230 may include a resin such as polyimide resin. The passivation layer pattern 230 may be formed by a spin coating process using a polyimide oligomer, a photolithography process, an etching process or a hardening process. In another example embodiment of the present invention, the passivation layer pattern 230 may include an oxide such as silicon oxide, or a nitride such as silicon nitride.

The first opening 232 may serve as an alignment key in a subsequent wire bonding process. In addition, the first opening 232 may have various shapes. For example, the opening 232 may have a clamp shape (as illustrated in FIG. 3), a rectangular shape, or circular shape.

The first opening 232 may have a width substantially narrower than a width of the exposed second metal wiring 220a. For example, the first opening 232 exposes a portion of the exposed second metal wiring 220a except for both edge portions of the exposed second metal wiring 220a. Alternatively, the first opening 232 may expose a central portion of the exposed second metal wiring 220a. Each of the both edge portions of the exposed second metal wiring 220a may have a width L1 of about 0.1 μm to about 1 μm.

When the width of the first opening 232 is wider than the width of exposed the second metal wiring 220a, other second metal wirings 220b adjacent to the exposed second metal wiring 220a may be damaged by an etchant such as plasma when forming the first opening 232. In addition, the first metal wiring 210 in the insulating interlayer 212 may become damaged due to a plasma etchant.

Since the width of the first opening 232 is narrower than the width of the exposed second metal wiring 220a, etching damage to the second metal wirings 220b may be prevented when forming the first and the second openings 232 and 234 and the first metal wiring 210 may also be sufficiently protected by the exposed second metal wiring 220a.

Figure 6:
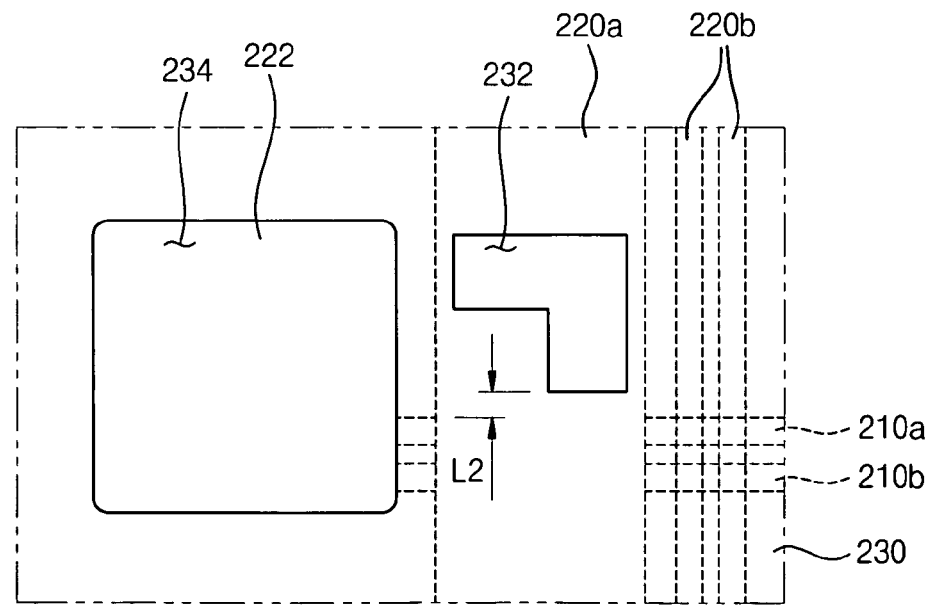
FIG. 6 is a plan view illustrating an alignment key structure in a semiconductor device in accordance with an example embodiment of the present invention.

FIG. 6 is a plan view illustrating an alignment key structure in a semiconductor device in accordance with an example embodiment of the present invention.

As shown in FIG. 6, since alignment errors may occur in etching processes when forming a first opening 232 and a second opening 234, it is preferable that first metal wirings 210a and 210b not be overlapped with the first opening 232. The first metal wirings 210a and 210b may be separated from the first opening 232 along a second direction where second metal wirings 220a and 220b are extended. An interval L2 between the first opening 232 and the first metal wiring 210a may be in a range of about 0.1 µm to about 1 µm.

Figure 7:
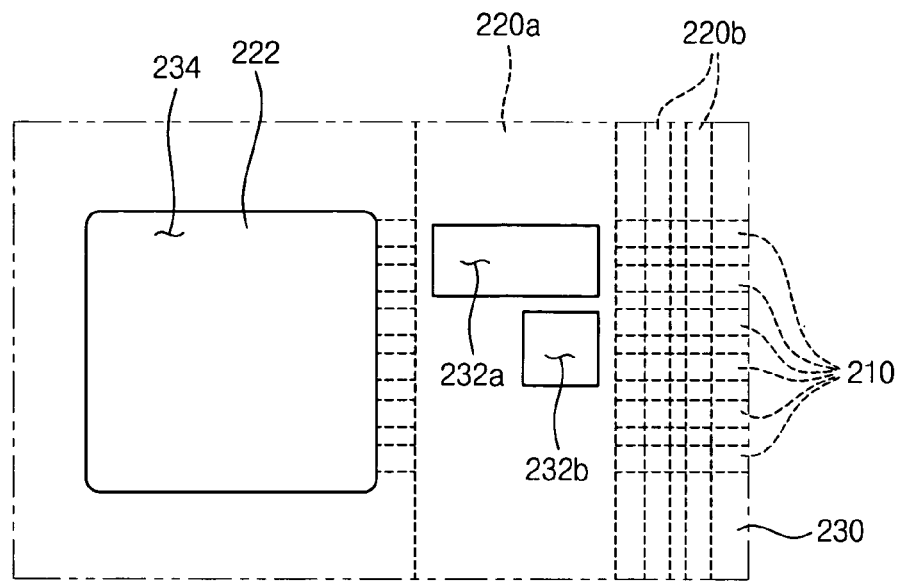
FIG. 7 is a plan view illustrating an alignment key structure in a semiconductor device in accordance with an example embodiment of the present invention.

FIG. 7 is a plan view illustrating an alignment key structure in a semiconductor device in accordance with an example embodiment of the present invention.

Referring to FIG. 7, the alignment key structure of the semiconductor device includes a plurality of first openings 232a and 232b that expose a second metal wiring 220a (e.g., a power line or a ground line) adjacent to a bonding pad 222. Since the first openings 232a and 232b expose only the second metal wiring 220a, etching damage to the second metal wirings 220b and to the first metal wiring 210 due to a plasma etchant may be prevented in an etching process for forming the first metal wirings 232a and 232b.

Referring again to FIG. 3, the first opening 232 and the second opening 234 are formed independently. Alternatively, the first opening 232 and the second opening 234 may be connected to each other. When the first opening 232 is connected to the second opening 234, the first metal wirings 210 is not positioned on the lower portions of the second insulating interlayer 224 between the exposed second metal wiring 220a and the bonding pad 222 because the first metal wirings 210 may become damaged when forming the first opening 232 and the second opening 234 connected each other.

Figure 8:
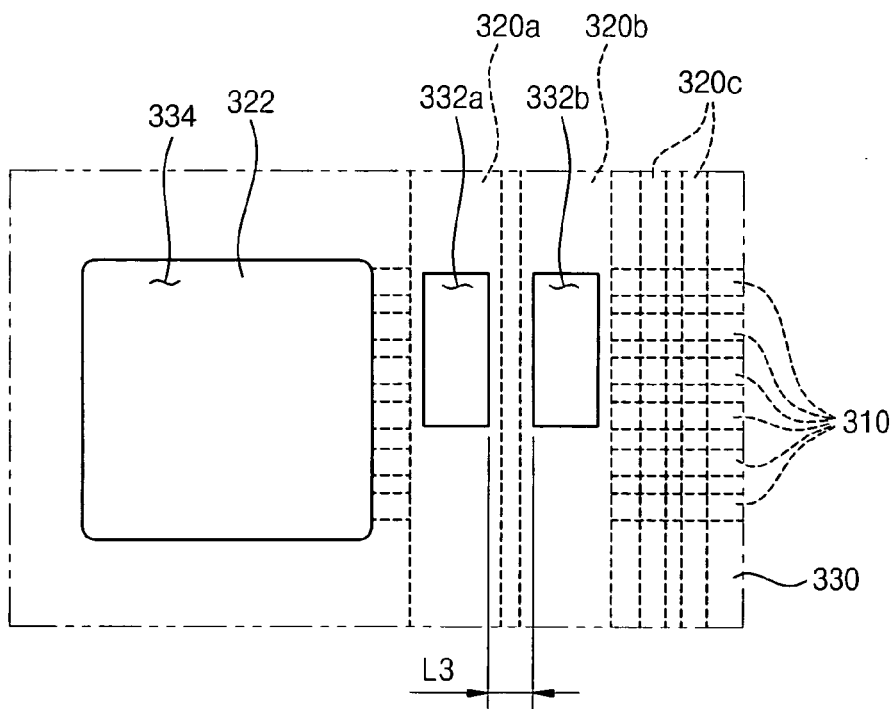
FIG. 8 is a plan view illustrating an alignment key structure in a semiconductor device in accordance with an example embodiment of the present invention.

FIG. 8 is a plan view illustrating an alignment key structure in a semiconductor device in accordance with an example embodiment of the present invention.

Referring to FIG. 8, an insulation structure including integrated circuits is formed on a substrate. A first insulating interlayer and a second insulating interlayer are formed on the insulation structure. The first insulating interlayer includes first metal wirings 310 electrically contacted to the integrated circuits. The second insulating interlayer includes a bonding pad 322, and second metal wirings 320a, 320b and 320c electrically contacted to the integrated circuits.

As shown in FIG. 8, the first metal wirings 310 may be extended along a first direction, and the second metal wirings 320a, 320b and 320c may be extended in a second direction substantially perpendicular to the first direction. The second metal wirings 320a, 320b and 320c include a power line 320a adjacent to the bonding pad 322, a ground line 320b and signal lines 320c. The power line 320a and the ground line 320b may have widths substantially wider than the widths of the signal lines 320c. In addition, the second metal wirings 320a, 320b and 320c may include at least two of the power lines 320a adjacent to the bonding pad 222 and at least two of the ground lines 320b.

A passivation layer pattern 330 is formed on the second insulating interlayer. The passivation layer pattern 330 includes first openings 332a and 332b, and a second opening 334. The first openings 332 expose the power line 320a and the ground line 320b, respectively. Additionally, the first openings 332 may serve as alignment keys in a subsequent wire bonding process. The second opening 334 exposes the bonding pad 322.

The first openings 332a and 332b may be extended along the second direction. The first openings 332a and 332b expose the power line 320a and the ground line 320b, respectively. Additionally, the first openings 332 may have widths substantially narrower than widths of the power line 320a and the ground line 320b. Particularly, the first openings 332a and 332b expose portions of the power line 320a and the ground line 320b except for edge portions of the exposed power line 320a and the ground line 320b, respectively. Alternatively, the first openings 332a and 332b expose central portions of the exposed power line 320a and the exposed ground line 320b. An interval L3 between the first opening 332a and the first opening 332b may be in a range of about 0.4 µm and about 2 µm. Consequently, the signal lines 332c are not damaged in the etching processes for forming the first openings 332a and 332a, and the second opening 334. Further, the first metal wirings 310 positioned beneath the first openings 332a and 332b are not damaged by the plasma etchant.

Figure 9:
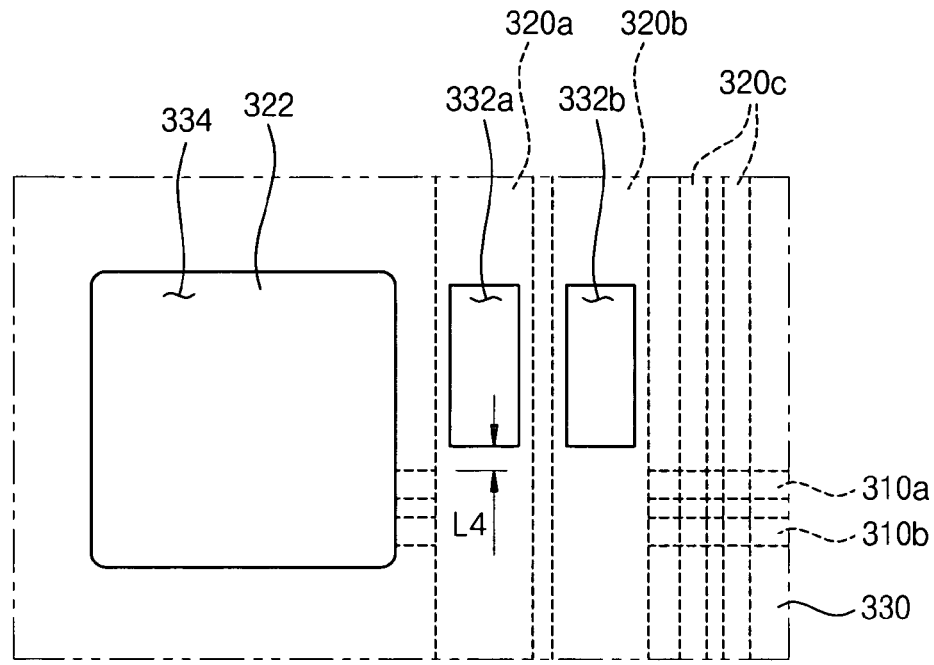
FIG. 9 is a plan view illustrating an alignment key structure in a semiconductor device in accordance with an example embodiment of the present invention.

FIG. 9 is a plan view illustrating an alignment key structure in a semiconductor device in accordance with an example embodiment of the present invention.

Since alignment errors may be generated in the etching processes for forming the first openings 332a and 332b, and the second opening 334, the first metal wirings 310a and 310b are not overlapped with the first openings 332a and 332b as shown in FIG. 9. Additionally, the first metal wirings 310a and 310b may be separated from the first openings 332a and 332b along the second direction where the second metal wirings 320a, 320b and 320c are extended. An interval L4 between the first metal wiring 310a and the first openings 332a and 332b may be in a range of about 0.1 µm to about 1 µm.

Figure 10:
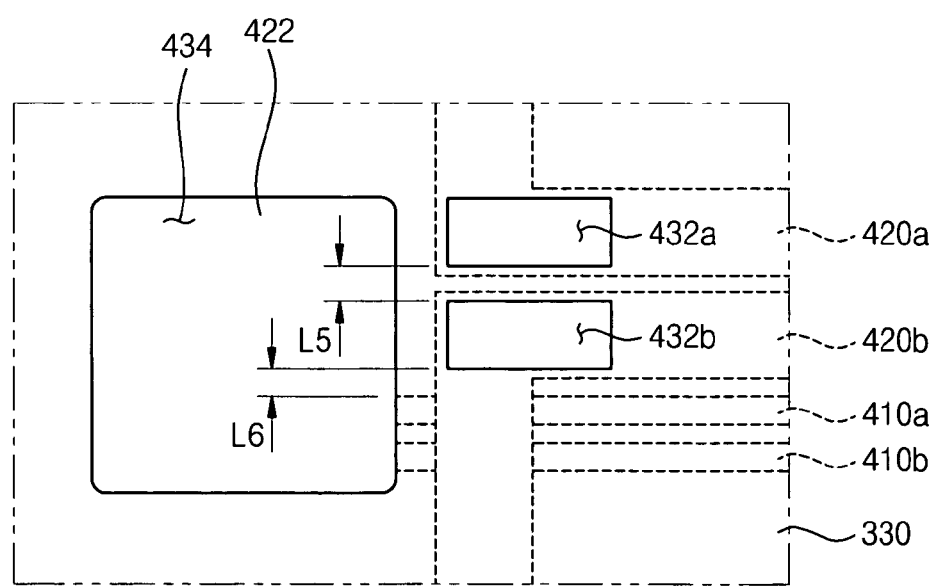
FIG. 10 is a plan view illustrating an alignment key structure in a semiconductor device in accordance with an example embodiment of the present invention.

FIG. 10 is a plan view illustrating an alignment key structure in a semiconductor device in accordance with an example embodiment of the present invention.

Referring to FIG. 10, an insulation structure including integrated circuits is formed on a substrate. A first insulating interlayer and a second insulating interlayer are formed on the insulation structure. The first insulating interlayer includes first metal wirings 410a and 410b electrically contacted to the integrated circuits. The second insulating interlayer includes a bonding pad 422, and second metal wirings 420a and 420b electrically contacted to the integrated circuits.

As shown in FIG. 10, the first metal wirings 410a and 410b may be extended along a first direction and the second metal wirings 420a and 420b may be extended along the first direction after the second metal wirings 420a and 420b are extended in a second direction substantially perpendicular to the first direction. Also, the second metal wirings 420a and 420b may be separated from the bonding pad 422. The second metal wirings 420a and 420b are referred to as a power line 420a and a ground line 420b hereinafter, respectively. The second metal wirings 420a and 420b may include at least two power lines 420a and at least two ground lines 420b. The power line 420a and the ground line 420b may have widths substantially wider than widths of signal lines.

A passivation layer pattern 430 is formed on the second insulating interlayer. The passivation layer pattern 430 includes first openings 432a and 432b, and a second opening 434. The first openings 432a and 432b expose the power line 420a and the ground line 420b, respectively. Additionally, the first openings 432a and 432b may serve as alignment keys in a subsequent wire bonding process. Further, the second opening 434 exposes the bonding pad 422.

The first openings 432a and 432b may be extended along the first direction. The first openings 432a and 432b expose the power line 420a and the ground line 420b, respectively.

Additionally, the first openings 432a and 432b may have widths substantially narrower than widths of the power line 420a and the ground line 420b. Moreover, the first openings 432a and 432b expose portions of the power line 420a and the ground line 420b except for edge portions of the exposed power line 420a and the ground line 420b, respectively. Alternatively, the first openings 432a and 432b expose central portions of the power line 420a and the ground line 420b. An interval L5 between the first openings 432a and 432b may be in a range of about 0.4 μm and about 2 μm. Thus, the first metal wirings 410a and 410b positioned beneath the first openings 432a and 432b may not be damaged by plasma in etching processes for forming the first openings 432a and 432b, and the second opening 434.

Since alignment errors may be generated in the etching processes for forming the first openings 432a and 432b, and the second opening 434, the first metal wirings 410a and 410b are separated from the first openings 432a and 432b along the second direction. An interval L6 between the first opening 432b and the first metal wiring 410a may be in a range of about 0.1 μm to about 1.0 μm.

Hereinafter, a method of forming alignment key structures of a semiconductor device in accordance with an example embodiment of the present invention will be described.

Referring again to FIGS. 3 to 5, the insulation structure 202 including the integrated circuits is formed on the substrate 200. The integrated circuits may include, for example, a dynamic random access memory (DRAM) device, a static random access memory (SRAM) device, or a flash memory device. The integrated circuits may be electrically insulated using an insulation material such as, for example, silicon oxide, silicon nitride, silicon oxynitride and a low-k material. In addition, the integrated circuits may be formed by performing a series of unit processes repeatedly. The unit processes may include, for example a diffusion process, an oxidation process, a deposition process, a photolithography process, an etching process, an ion implantation process, and a polishing process.

A first conductive layer is formed on the insulation structure 202 to form the first metal wirings 210. The first conductive layer may be formed using a metal such as, for example, aluminum (Al), tungsten (W), titanium (Ti), tantalum (Ta), or copper (Cu).

In an example embodiment of the present invention, a metal nitride layer serving as a barrier layer may be formed before forming the first conductive layer or after forming the first conductive layer. The metal nitride layer may be formed using, for example, titanium nitride, tungsten nitride, or tantalum nitride. Additionally, the first conductive layer and the metal nitride layer may each be formed by CVD processes, atomic layer deposition (ALD) processes, and physical vapor deposition (PVD) processes.

A first photoresist pattern is formed on the first conductive layer through a photolithography process. The first conductive layer is etched by an anisotropic etching process using the first photoresist pattern as an etching mask to form the first metal wirings 210 on the insulation structure 210. The first metal wirings 210 may be electrically connected to the integrated circuits in the insulation structure 202. Additionally, the first metal wirings 210 may serve as signal lines.

The first insulating interlayer 212 is formed on the first metal wirings 210. The first insulating interlayer 212 may be formed using an oxide such as BPSG, PSG, USG, SOG, TEOS, HDP-CVD oxide, etc. Alternatively, the first insulating interlayer 212 may be formed using a nitride such as silicon nitride or a low-k material. In addition, the first insulating interlayer 212 may be partially removed by a CMP process, an etch back process, or a combination process of CMP and etch back to planarize the first insulating interlayer 212.

A second conductive layer is then formed on the first insulating interlayer 212 to form second metal wirings 220a and 220b, and a bonding pad 222. The second conductive layer may be formed by a process substantially identical to the above-described process for forming the first conductive layer.

The second conductive layer is then patterned to thereby form the second metal wirings 220a and 220b, and the bonding pad 222. In this exemplary embodiment of the present invention, a second photoresist pattern is formed on the second conductive layer. The second conductive layer is then etched by an anisotropic etching process using the second photoresist pattern as an etching mask to form the second metal wirings 220a and 220b, and the bonding pad 222. In the process for forming the second metal wirings 220a and 220b, and the bonding pad 222, the power line and the ground line having widths substantially wider than the widths of the signal lines are located adjacent to the bonding pad 222.

The second insulating interlayer 224 is formed on the second metal wirings 220a and 220b, and the bonding pad 222. Subsequently, the second insulating interlayer 224 is planarized. The second insulating interlayer 224 may be formed using a nitride such as silicon nitride. Additionally, the second insulating interlayer 224 may be formed by a low pressure CVD process. The second insulating interlayer 224 may be planarized by a CMP process, an etch back process, or a combination process of CMP and etch back.

The passivation layer pattern 230 is formed on the second insulating interlayer 224. The passivation layer pattern 230 includes a first opening 232 exposing one second metal wiring 220a adjacent to the bonding pad 222, and a second opening 234 exposing the bonding pad 222. The passivation layer pattern 230 may be formed using a resin such as polyimide resin. The passivation layer pattern 230 may be formed by a spin coating process using a polyimide oligomer, a photolithography process, an etching process and a hardening process. The spin coating process is performed to form a passivation layer on the second insulating interlayer 224. The photolithography process is carried out to form a third photoresist pattern for forming the first opening 232 and the second opening 234. The etching process is performed to form the first opening 232 and the second opening 234. Further, the hardening process is executed to harden the passivation layer pattern 230.

The second metal wiring 220a adjacent to the bonding pad 222, the passivation layer pattern 230 on the bonding pad 222 and the second insulating interlayer 224 are partially removed in the etching process using the third photoresist pattern as an etching mask. Here, the opening 232 may have a width substantially narrower than a width of the exposed second metal wiring 220.

As shown in FIG. 6, the first metal wirings 210a and 210b is not overlapped with the first opening 232. Alternatively, the plurality of first openings 232a and 232b may be formed as shown in FIG. 7. In this case, the first openings 232a and 232b expose the second metal wiring 220a adjacent to the bonding pad 222.

Further, as shown in FIGS. 8 to 10, the power lines 320a and 420a, and the ground lines 320b and 420b may be formed adjacent to bonding pads 322 and 422. The first openings 332a, 332b, 432a and 432b exposing the power lines 320a and 420a, and the ground lines 320b and 420b, respectively may be formed.

Referring again to FIGS. 3 to 5, the first metal wirings 210, the second metal wirings 220a and 220b, and the bonding pad 222 may be formed by damascene processes, respectively. In an example embodiment of the present invention, a first insulation layer pattern is formed on the insulation structure 202. A first conductive layer is formed on the first insulation layer pattern. The insulation layer pattern may be formed using an oxide such as silicon oxide or a nitride such as silicon nitride. Additionally, the insulation layer pattern may be formed by a photolithography process and an etching process. The first conductive layer is partially removed by a CMP process, an etch back process, or a combination process of CMP and etch back to form first metal wirings 210.

A third insulating interlayer is formed on the first insulation layer pattern and on the first metal wirings 210. The third insulating interlayer may include a material substantially the same as that of the first insulation layer pattern. A second insulation layer pattern is formed on the third insulating interlayer to form the second metal wirings 220a and 220b, and the bonding pad 222. A second conductive layer is formed on the second insulation layer pattern. The second conductive layer is partially removed by a CMP process, an etch back process, or a combination process of CMP and etch back to form the second metal wirings 220a and 220b, and the bonding pad 222. A fourth insulating interlayer is formed on the second metal wirings 220a and 220b, the bonding pad 222 and the second insulation layer pattern.

According to the example embodiments of the present invention, a first opening may serve as an alignment key in a wire bonding process to expose a second metal wiring adjacent to a bonding pad. Furthermore, the first opening may have a width substantially narrower than a width of the second metal wiring. Consequently, etching damage to the second metal wiring and to the first metal wiring may be effectively prevented in an etching process for forming the first opening.

Additionally, with the alignment key structures of example embodiments of the present invention, when alignment errors are generated between the first opening and the second metal wiring, damage to the first metal wiring may be prevented or avoided because the first metal wiring is separated from the first opening.

Accordingly, since the first and the second metal wirings of the alignment key structures of the example embodiments are sufficiently protected when the first opening is formed, signal noises in a semiconductor device including the first and the second metal wirings are thus also reduced. As a result, the semiconductor device may have improved reliability and enhanced productivity.

Having described the example embodiments of the present invention, it is further noted that it is readily apparent to those of reasonable skill in the art that various modifications may be made without departing from the spirit and scope of the present invention which is defined by the metes and bounds of the appended claims.

What is claimed is:

1. An alignment key structure in a semiconductor device, comprising:
    an insulation layer formed on a substrate, the insulation layer comprising a plurality of metal wirings; and
    a passivation layer pattern formed on the insulation layer, the passivation layer pattern comprising a first opening that exposes at least one of the metal wirings and serves as alignment keys in a process of manufacturing the semiconductor device,
    wherein the first opening has a width substantially narrower than a width of the exposed metal wiring.

2. The alignment key structure of claim 1, wherein the first opening exposes a portion of the exposed metal wiring except for both edge portions of the exposed metal wiring.

3. The alignment key structure of claim 2, wherein each of the both edge portions of the exposed metal wiring has a width of about 0.1 µm to about 1.0 µm.

4. The alignment key structure of claim 1, wherein the insulation layer comprises a bonding pad adjacent to the exposed metal wiring.

5. The alignment key structure of claim 4, wherein the passivation layer pattern comprises a second opening that exposes the bonding pad.

6. The alignment key structure of claim 1, wherein the exposed metal wiring comprises a power line or a ground line.

7. The alignment key structure of claim 1, wherein the exposed metal wiring has the width substantially wider than widths of other metal wirings.

8. An alignment key structure in a semiconductor device, comprising:
    a first insulation layer formed on a substrate, the first insulation layer comprising a plurality of first metal wirings;
    a second insulation layer formed on the first insulation layer, the second insulation layer comprising a plurality of second metal wirings and a bonding pad; and
    a passivation layer pattern formed on the second insulation layer, the passivation layer pattern comprising a first opening that exposes one of the second metal wirings adjacent to the bonding pad and serves as an alignment key in a process of manufacturing the semiconductor device,
    wherein the first opening has a width substantially narrower than a width of the exposed second metal wiring.

9. The alignment key structure of claim 8, wherein the first metal wirings are extended along a first direction and the second metal wirings are extended in a second direction substantially perpendicular to the first direction, and wherein the first metal wirings are separated from the fist opening along the second direction.

10. The alignment key structure of claim 9, wherein one of the first metal wirings adjacent to the first opening is separated from the first opening by an interval of about 0.1 µm to about 1.0 µm.

11. The alignment key structure of claim 8, wherein the first opening exposes a central portion of the exposed second metal wiring except for both edge portions of the exposed second metal wiring.

12. The alignment key structure of claim 8, wherein the passivation layer pattern comprises a second opening that exposes the bonding pad.

13. The alignment key structure of claim 12, wherein the first opening and the second opening are connected to each other, and wherein the first metal wirings are not overlapped with a portion of the second insulation layer between the bonding pad and the exposed second metal wiring.

14. An alignment key structure in a semiconductor device, comprising:
    a first insulation layer formed on a substrate, the first insulation layer comprising a plurality of first metal wirings;
    a second insulation layer formed on the first insulation layer, the second insulation layer comprising a plurality of second metal wirings; and
    a passivation layer pattern formed on the second insulation layer, the passivation layer pattern comprising first openings that exposes adjacent second metal wirings and serves as alignment keys in a process of manufacturing the semiconductor device and wherein the first openings have a width substantially narrower than a width of the exposed second metal wirings.

15. The alignment key structure of claim 14, wherein the exposed second metal wirings comprise a power line and a ground line.

16. The alignment key structure of claim 14, wherein the exposed second metal wirings include power lines and ground lines.

17. The alignment key structure of claim 14, wherein the second insulation layer comprises a bonding pad adjacent to the exposed second metal wirings.

18. The alignment key structure of claim 17, wherein the passivation layer pattern comprises a second opening that exposes the bonding pad.

19. The alignment key structure of claim 14, wherein intervals among the first openings are in a range of about 0.4 μm to about 2.0 μm.

20. The alignment key structure of claim 14, wherein the first metal wirings are extended along a first direction and the second metal wirings are extended in a second direction substantially perpendicular to the first direction, and wherein the first metal wirings are separated from the one or more first openings along the second direction.

21. A method of forming an alignment key structure in a semiconductor device, the method comprising:
    forming an insulation layer comprising a plurality of metal wirings on a substrate; and
    forming a passivation layer pattern comprising a first opening on the insulation layer, the first opening exposing at least one of the metal wirings and serving as an alignment key in a process of manufacturing the semiconductor device,
    wherein the first opening has a width substantially narrower than a width of the exposed metal wiring.

22. The method of claim 21, wherein the first opening exposes a portion of the exposed metal wiring except for both edge portions of the exposed metal wiring.

23. The method of claim 21, wherein forming the insulation layer comprises:
    forming the metal wirings on the substrate; and
    forming the insulation layer on the metal wirings,
    wherein a bonding pad adjacent to the exposed metal wiring is simultaneously formed when forming the metal wirings.

24. The method of claim 21, wherein forming the passivation layer pattern comprises:
    forming a passivation layer on the insulation layer; and
    partially etching the passivation layer and the insulation layer to form the first opening,
    wherein a second opening exposing the bonding pad is simultaneously formed when forming the first opening.

25. The method of claim 21, wherein the exposed metal wiring has a width, substantially wider than widths of other metal wirings.

26. A method of forming an alignment key structure in a semiconductor device, the method comprising:
    forming a first insulation layer comprising a plurality of first metal wirings on a substrate;
    forming a second insulation layer comprising a plurality of second metal wirings and a bonding pad on the first insulation layer; and
    forming a passivation layer pattern comprising a first opening on the second insulation layer, the first opening exposing one of the second metal wirings adjacent to the bonding pad and serving as an alignment key in a process of manufacturing the semiconductor device,
    wherein the first onening has a width substantially narrower than a width of the exposed second metal wiring.

27. The method of claim 24, wherein the first metal wirings are extended along a first direction and the second metal wirings are extended in a second direction substantially perpendicular to the first direction, and wherein the first metal wirings are separated from the first opening along the second direction.

28. The method of claim 24, wherein the first opening exposes a central portion of the exposed second metal wiring except for both edge portions of the exposed second metal wiring.

29. The method of claim 24, wherein forming the passivation layer pattern comprises:
    forming a passivation layer on the second insulation layer; and
    partially etching the passivation layer and the second insulation layer to form the first opening,
    wherein a second opening exposing the bonding pad is simultaneously formed in a formation of the first opening.

30. The method of claim 29, wherein the first opening and the second opening are connected to each other, and wherein the first metal wirings are not overlapped with a portion of the second insulation layer between the bonding pad and the exposed second metal wiring.

31. A method of forming an alignment key structure in a semiconductor device, the method comprising:
    forming a first insulation layer comprising a plurality of first metal wirings on a substrate;
    forming a second insulation layer comprising a plurality of second metal wirings on the first insulation layer; and
    forming a passivation layer pattern comprising first openings on the second insulation layer, the first openings exposing adjacent second metal wirings and serving as alignment keys in a process for manufacturing the semiconductor device and wherein the first openings have a width substantially narrower than a width of the exposed second metal wirings.

32. The method of claim 31, wherein forming the second insulation layer comprises:
    forming the second metal wirings on the first insulation layer; and
    forming the second insulation layer on the second metal wirings,
    wherein a bonding pad adjacent the exposed second metal wirings is simultaneously formed when forming the second metal wirings.

33. The method of claim 32, wherein forming the passivation layer pattern comprises:
    forming a passivation layer on the second insulation layer; and
    partially etching the passivation layer and the second insulation layer to form the first openings,
    wherein a second opening exposing the bonding pad is simultaneously formed when forming the first openings.

34. The method of claim 31, wherein the first metal wirings are extended along a first direction and the second metal wirings are extended in a second direction substantially perpendicular to the first direction, and wherein the first metal wirings are separated from the first openings along the second direction.

* * * * *